US009644961B2

(12) United States Patent
Aaltonen

(10) Patent No.: US 9,644,961 B2
(45) Date of Patent: May 9, 2017

(54) DRIVE CIRCUIT FOR A MEMS RESONATOR

(71) Applicant: MURATA MANUFACTURING CO., LTD., Nagaokakyo-shi, Kyoto (JP)

(72) Inventor: Lasse Aaltonen, Espoo (FI)

(73) Assignee: MURATA MANUFACTURING CO., LTD., Kyoto (JP)

( * ) Notice: Subject to any disclaimer, the term of this patent is extended or adjusted under 35 U.S.C. 154(b) by 150 days.

(21) Appl. No.: 14/618,006

(22) Filed: Feb. 10, 2015

(65) Prior Publication Data
US 2015/0226556 A1   Aug. 13, 2015

(30) Foreign Application Priority Data

Feb. 12, 2014 (FI) ...................................... 20145137

(51) Int. Cl.
G01C 19/5712 (2012.01)
G01C 19/5776 (2012.01)
H03H 7/00 (2006.01)
H03L 7/08 (2006.01)
H03L 7/099 (2006.01)
H03H 7/01 (2006.01)

(52) U.S. Cl.
CPC ..... G01C 19/5712 (2013.01); G01C 19/5776 (2013.01); H03H 7/002 (2013.01); H03L 7/0805 (2013.01); H03L 7/099 (2013.01); H03H 7/0153 (2013.01); H03H 2007/008 (2013.01)

(58) Field of Classification Search
CPC ............ G01C 19/5712; G01C 19/5776; G01C 19/5762; G01C 19/5726

USPC ......................................... 73/504.12, 504.04
See application file for complete search history.

(56) References Cited

U.S. PATENT DOCUMENTS

| 5,327,302 | A   | 7/1994  | Khoury et al. |
| 5,432,827 | A   | 7/1995  | Mader |
| 7,352,249 | B2  | 4/2008  | Balboni et al. |
| 7,941,723 | B1  | 5/2011  | Lien et al. |
| 8,850,887 | B2* | 10/2014 | Yanagisawa ........... G01C 19/56 |
|           |     |         | 73/504.12 |
| 8,912,856 | B2* | 12/2014 | Cazzaniga ......... G01C 19/5776 |
|           |     |         | 331/154 |

(Continued)

FOREIGN PATENT DOCUMENTS

| EP | 2 282 404 A1 | 2/2011 |
| EP | 2 336 717 A1 | 6/2011 |
| EP | 2 360 448 A1 | 8/2011 |

OTHER PUBLICATIONS

International Search Report dated May 22, 2015 corresponding to International Patent Application No. PCT/IB2015/050903.

(Continued)

Primary Examiner — Helen Kwok
(74) Attorney, Agent, or Firm — Squire Patton Boggs (US) LLP

(57) ABSTRACT

A drive loop circuit for a MEMS resonator. The circuit comprises a closed loop circuit to detect and amplify a signal of the MEMS resonator, a phase shifting circuit to phase shift the detected and amplified signal, and a feedback circuit to feed the detected, amplified and phase shifted signal as a feedback signal back to the MEMS resonator. The phase shifting circuit can include a low pass filter of at least $2^{nd}$ order.

19 Claims, 8 Drawing Sheets

(56) References Cited

U.S. PATENT DOCUMENTS

| | | | |
|---|---|---|---|
| 2011/0050214 A1 | 3/2011 | Bahreyni et al. | |
| 2013/0239680 A1* | 9/2013 | Prandi | G01C 19/5726 73/504.12 |
| 2013/0335153 A1 | 12/2013 | Maru | |
| 2015/0226557 A1* | 8/2015 | Aaltonen | G01C 19/5712 73/504.12 |

OTHER PUBLICATIONS

Lasse Aaltonen et al., "Continuous-time interface for a micromachined capacitive accelerometer with NEA of 4mug and bandwidth of 300 Hz," Sensors and Actuators A, Elsevier Sequoia S.A., vol. 154, No. 1, Aug. 31, 2009, pp. 46-56, XP026498372.

Hsin-Chih Li et al., "Study of CMOS micromachined self-oscillating loop utilizing a phase-locked loop-driving circuit," Journal of Micromechanics & Microengineering, Institute of Physics Publishing, vol. 22, No. 5, Apr. 19, 2012, pp. 1-9, XP020222490.

Lasse Aaltonen et al., "High Resolution Analog Interface for Micromachined Capacitive Accelerometer," Circuit Theory and Design, 2007. ECCTD 2007, 18th European Conference on, IEEE, Aug. 27, 2007, pp. 96-99, XP031257696.

Lasse Aaltonen et al., "Fully Integrated Charge Pump for High Voltage Excitation of a Bulk Micromachined Gyroscope," Conference Proceedings/IEEE International Symposium on Circuits and Systems (ISCAS): May 23-26, 2005, International Conference Center, May 23, 2005, pp. 5381-5384, XP010816748.

L. Aaltonen et al., "An analog drive loop for a capacitive MEMS gyroscope," Analog Integrated Circuits and Signal Processing, Kluwer Academic Publishers, vol. 63, No. 3, Sep. 23, 2009, pp. 465-476, XP019786428.

Lasse Aaltonen et al., "An Interface for a 300•/s Capacitive 2-Axis Micro-Gyroscope with Pseudo-CT Readout," Solid-State Circuits Conference—Digest of Technical Papers, 2009. ISSCC 2009. Feb. 8, 2009, pp. 344-345, 345a, XP031742290.

Finnish Search Report dated Oct. 8, 2014 corresponding to Finnish Patent Application No. 20145137.

H.-C. Li et al., "Study of CMOS micormachined self-oscillating loop utilizing a phase-locked loop-driving circuit," J. Micromech. Microeng., 2012, vol. 22, pp. 055024-1-055024-9.

Mikko Saukoski et al, "Interface and Control Electronics for a Bulk Micromachined Capacitive Gyroscope", Sensors and Actuators A: Physical, 2008, pp. 183-193.

A. Tocchio et al., "Resolution and Start-Up Dynamics of MEMS Resonant Accelerometers", IEEE Sensors, 2011, pp. 161-164.

Finnish Search Report application No. 20145136 dated Oct. 8, 2014.

International Search Report application No. PCT/IB2015/050902 mailed Sep. 9, 2015.

* cited by examiner

DRIVE CIRCUIT FOR A MEMS RESONATOR

BACKGROUND

Field

The present invention relates to microelectromechanical systems and specifically to a closed loop drive circuitry for driving a MEMS resonator.

Description of the Related Art

Stable and low noise resonators are needed, for example, as primary (drive) resonators in vibratory MEMS gyroscopes. As the Coriolis force is directly proportional to the velocity of the driven resonator, the precision of its motion is essential. In an ideal case the drive loop, which realizes the oscillator, should keep the velocity of the drive resonator constant. As environmental variation always inflicts changes in the properties of the MEMS, constant velocity can only be approximated. MEMS resonator is any small size device that can be made to vibrate at least at one resonant frequency or resonance mode by exciting it at the resonant frequency drive force.

Another parameter of interest is the speed, at which the resonator attains the state of constant oscillation, i.e. start-up time. In a capacitively excited MEMS resonator, the available drive force is limited and therefore the frequency of oscillation is set by the main resonance mode of the element. This allows minimization of the required drive voltage. On the other hand, quick start-up typically refers to high drive force and high gain during start-up.

SUMMARY

An object of the invention is to provide a closed loop drive circuitry for driving a MEMS resonator, which attains a stable and low noise oscillation, and in which the state of constant oscillation is achieved reliably and in short time. This and other objects are achieved with embodiments as described herein.

Embodiments of the invention include a drive circuitry for a MEMS resonator. The circuitry includes closed loop means for detecting and amplifying a signal of the MEMS resonator, means for phase shifting the detected and amplified signal, and means for feeding the detected, amplified and phase shifted signal as a feedback signal back to the MEMS resonator. The means for phase shifting the detected and amplified signal include a low pass filter of at least $2^{nd}$ order.

The low pass filter may include a continuous-time low pass filter architecture, and/or the target nominal frequency of the low pass filter is equal to the mechanical resonance frequency of the MEMS resonator and/or the 90 degree phase shift target frequency of the low pass filter is equal to the mechanical resonance frequency of the MEMS resonator.

The claims define also a method for driving a MEMS resonator, a MEMS oscillator including the drive circuitry, and a MEMS gyroscope including the drive circuitry.

Further advantages of the invention are discussed in more detail with the following embodiments.

BRIEF DESCRIPTION OF THE DRAWINGS

In the following the invention will be described in greater detail, in connection with various embodiments, with reference to the attached drawings, in which.

DETAILED DESCRIPTION

The following embodiments are exemplary. Although the specification may refer to "an", "one", or "some" embodiment(s), this does not necessarily mean that each such reference is to the same embodiment(s), or that the feature only applies to a single embodiment. Single features of different embodiments may be combined to provide further embodiments.

In the following, features of the invention will be described with a simple example of a circuit structure with which various embodiments of the invention may be implemented. Only elements relevant for illustrating the embodiments are described in detail. Details that are generally known to a person skilled in the art may not be specifically described herein.

Solid objects typically have a natural frequency or group of frequencies at which they tend to oscillate at greater amplitude than at others. A system that resonates is herein considered as a resonator. A simple example of a resonator is a mass-spring system where a mass is suspended with a spring to a body in such a manner that a force exerted to the mass or acceleration of the body causes a proportional displacement of the mass with respect to the body. By means of electric circuitry, movement of the mass may be detected and transformed into measurable electrical signals. A mass-spring system is in an equilibrium state when the body is static and no net force acts on the mass. If the system is displaced from the equilibrium, the spring causes a net restoring force on the mass, tending to bring it back to equilibrium. However, in moving back to the equilibrium position, the mass acquires a momentum which keeps it moving beyond that position, establishing a new restoring force in the opposite sense. Hence, the mass begins to oscillate about the equilibrium state. The mass may be biased and its movement in respect of static electrodes then converted to an electrical signal. The harmonic oscillations of the mass thus transform into alternating electrical signals that represent movement of the body with respect to an inertial frame of reference.

Figure 1:
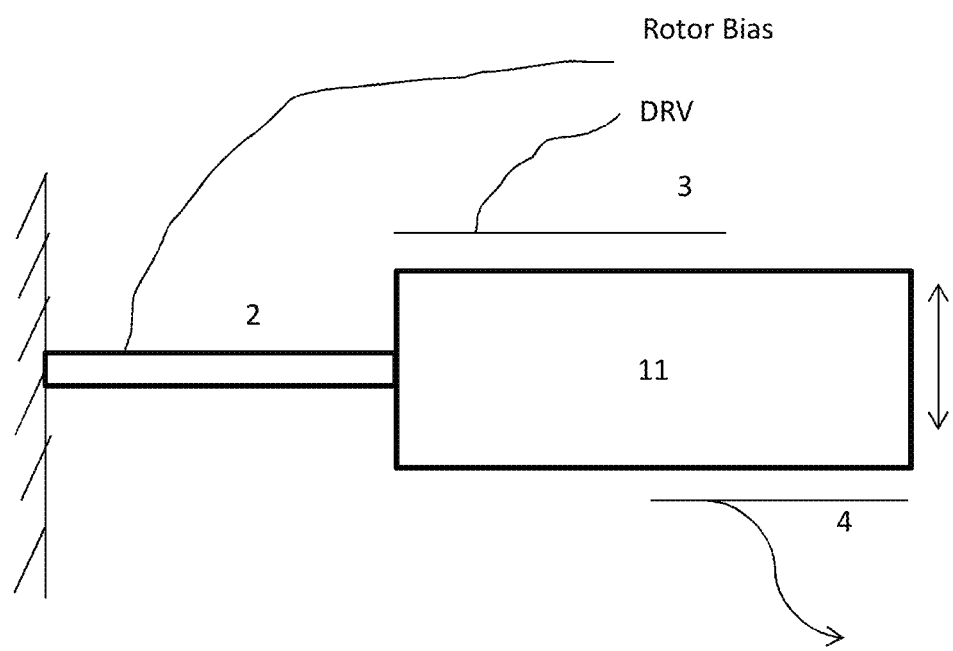
FIG. 1 illustrates one example of a resonator MEMS device.

FIG. 1 illustrates a simplified presentation of a MEMS resonator. The MEMS resonator can include a rotor mass member 1 suspended with beamlike spring 2. The rotor mass member 1 may be excited into motion by providing an electrostatic force between the rotor mass member 1 or an electrode attached to it and a drive electrode 3. We'll call the electrode formed by the rotor mass member 1 or the electrode attached to it as the rotor electrode. This pair of the rotor electrode and the drive electrode 3 may be called as capacitive drive means. When a separate rotor electrode is attached to the rotor mass member 1, it is preferably attached to the rotor mass member 1 so that it moves with the rotor mass member 1. In the exemplary configuration of FIG. 1, the electrostatic force is generated by connecting the drive electrode 3 to a first DC bias voltage and the rotor electrode to a second DC bias voltage. The first bias voltage is summed with an AC component that induces the exciting force for oscillation. Oscillation of the MEMS resonator may be controlled with a closed loop structure where biasing of the rotor electrode is dependent on measured amplitudes of the rotor mass member 1. For the necessary feedback, the structure may include at least one drive detection electrode 4. The pair of electrodes formed by the drive detection electrode 4 and the rotor electrode may be referred to as drive detection means. The exemplary structure of FIG. 1 is based on capacitive effect, wherein capacitance between electrodes changes when the distance between them changes. A displacement of the rotor mass member 1 causes change in distance between the electrodes, and this change may modulate an electrical signal output from the transducer. On the other hand, the rotor mass member 1 may be actuated by changing the electrostatic force between the drive electrode 3 and the rotor electrode. It may be noted, that in this exemplary arrangement, the rotor mass member 1 is used as the rotor electrode, and it's common to both the capacitive drive means and the drive detection means.

It is noted that the capacitive transducers in FIG. 1 are examples only. For example, capacitors may have parallel plates aligned to the direction of the rotor movement, whereby the area of capacitor changes instead of the capacitor plate distance. Comb type mufti-plate capacitors are commonly used as actuators and sensors.

Displacement may be detected, for example, by means of motion, stress or strain based on capacitive effect, piezoelectric effect, electromagnetic effect or piezoresistive effect. Displacement may be induced, for example, by force, torque, stress or strain based on electrostatic effect, piezoelectric effect, electromagnetic effect, thermoelastic effect, electrostriction or magnetostriction. Oscillation may be, for example, linear, rotational, torsional motion, or include a standing wave.

Purely continuous-time linear loop cannot excite unwanted resonances due non-linearity present in discrete-time setups, while power and silicon area consumption remains low, as similar linear operation does not need to be achieved by additional filters and/or high sample rates.

Figure 2:
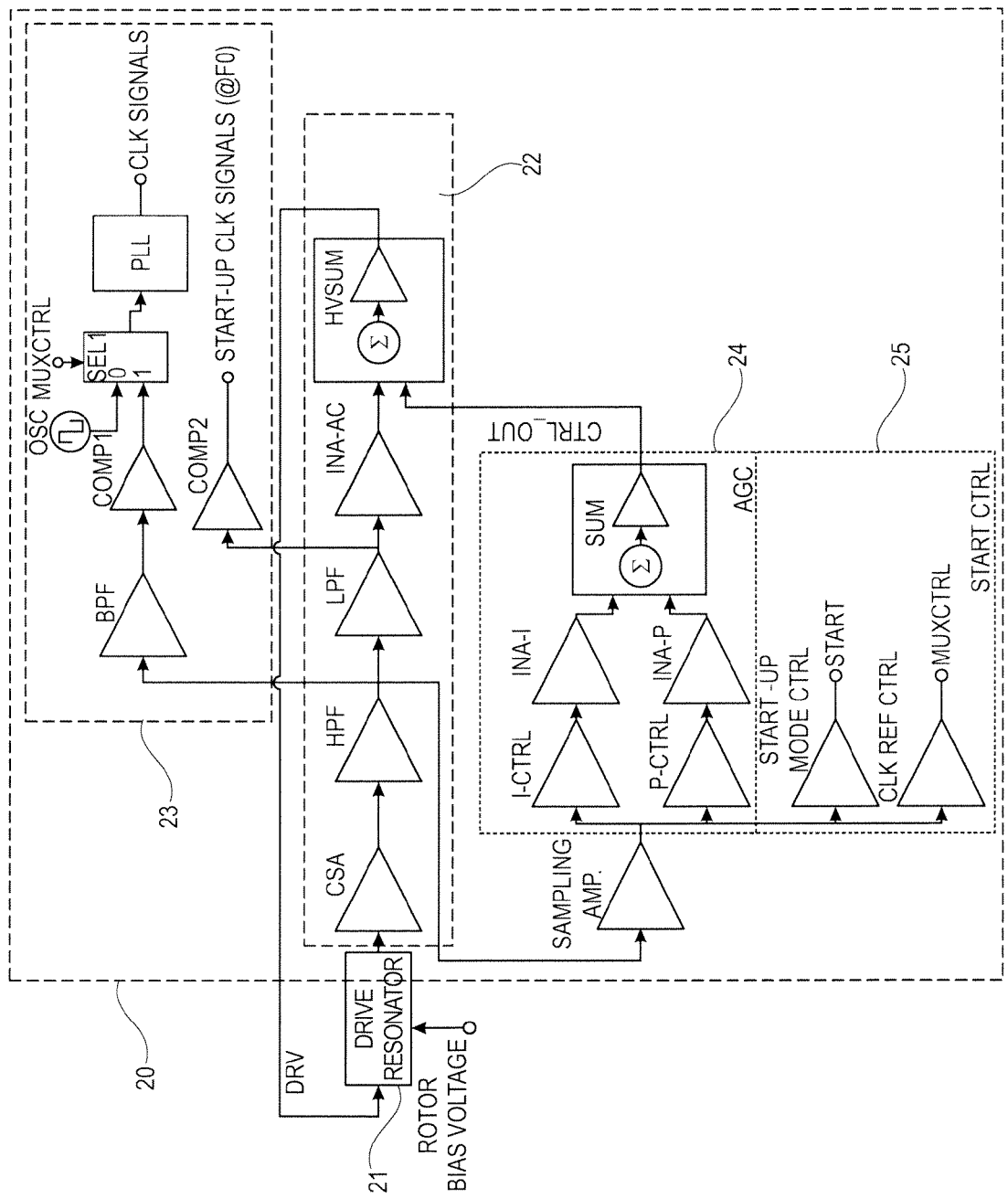
FIG. 2 presents an exemplary embodiment of a drive circuitry.

FIG. 2 presents an exemplary embodiment of a drive circuitry (20) for driving an MEMS vibrating gyroscope resonator (21). The drive circuitry (20) in FIG. 1 can include a drive loop (22), clock circuitry (23), an amplitude control circuitry AGC (24) and a start-up circuitry (25). The drive loop may be an analog linear, switched capacitor, or partly digital circuit. The analog and switched capacitor implementations are compact and low power implementations. A digital drive loop may have the benefit of being more configurable, but requires precise data converters. The drive loop (22) of FIG. 2 includes a detector amplifier (CSA), a gain providing high pass filter (HPF), a phase shifting element (LPF), an instrumentation amplifier (INA_AC), and a high voltage summing amplifier (HVSUM). If differential drive is applied, an instrumentation amplifier is not necessarily needed.

In comparison to some earlier solutions, the drive loop (22) does not include a comparator element for normalizing the drive amplitude. A non-linear element like a comparator would cause harmonic frequencies to occur in the drive loop (22), which could possibly require additional filtering arrangements for reducing any unwanted harmonics caused by such non-linear element. Such harmonics could cause unwanted movement for the MEMS resonator, such as at e.g. parasitic modal frequencies, or increase electrical cross-coupling at unwanted harmonic frequencies of fundamental oscillation frequency modes. Thus, avoiding a need to use a comparator improves stability of the nominal frequency of the drive loop (22) and the MEMS resonator, and/or reduces need for filtering due to harmonics likely created by the normalization.

The clock circuitry (23) may include a band-pass filter (BPF), a comparator (COMP1) and a phase-locked loop (PLL). We will later refer to this signal chain comprising the phase-locked loop PLL with phrase "clock generation circuitry comprising PLL" and the signal coming out of this signal chain is called as clock signal (CLK SIGNALS). While the output of the circuitry is marked to include a single signal, this clock signal may be further provided to multiple circuitries, and in combination these may be referred occasionally with plural form. The clock circuitry (23) may further include a second comparator (COMP2) for generation of an alternative clock signal used especially during the start-up state. Similarly, the clock signal provided by the second comparator (COMP2) is referred to as the start-up clock signal (START-UP CLK SIGNALS). Similar to the CLK SIGNALS, the start-up clock signal may be provided to multiple circuitries, and may therefore be also referred to in plural form. A notable difference between these two clock sources is that the start-up clock signals (START_UP CLK SIGNALS) possess frequency not higher than that of reference signal provided by the drive loop (22), whereas the PLL functionality used for producing the clock signals (CLK SIGNALS) enables generation of clock signals with higher frequencies.

The interface between the drive loop (22) and amplitude control circuitry AGC (24) and between the drive loop (22) and the start-up circuitry START CTRL (25) is provided by the sampling amplifier (SAMPLING AMP). It provides high precision amplitude demodulation, rectifying the incoming signal, which enables the amplitude control AGC (24) and start-up circuitry START CTRL (25) to further sample the amplitude information. The sampling amplifier (SAMPLING AMP) may include a switched capacitor derivator. It should be noted, that despite its name, the sampling amplifier includes circuitry preparing the input signal to be fit for subsequent sampling rather than sampling the signal. The amplitude control circuitry AGC (24) may include a sampling amplifier (SAMPLING AMP) and a PI-controller (elements I-CTRL, INA-I, P-CTRL, INA-P and a sum amplifier SUM).

The start-up circuitry (25) may include a start-up mode control circuitry (START-UP MODE CTRL), and a clock reference control circuitry (CLK REF CTRL). The division between the amplitude control circuitry (24) and start-up circuitry (25) is just a naming convention, and the actual division and naming of the circuitry functionalities may be chosen freely as understood by a person skilled in the art. For example, in the example presented in FIG. 2, the sampling amplifier (SAMPLING AMP) has been left outside the amplitude control circuitry (24) and the start-up circuitry (25), as it serves as an input stage for both the amplitude control circuitry (24) and the start-up circuitry (25). In an alternative, these functionalities may be considered as a single combined circuitry comprising all structural elements of the amplitude control circuitry AGC (24), start-up circuitry START CTRL (25) and even the sampling amplifier (SAMPLING AMP). In a further alternative, the sampling amplifier (SAMPLING AMP) may be placed logically into the amplitude control circuitry (24) or the start-up circuitry (25), and the output signal provided by the sampling amplifier (SAMPLING AMP) is made available to the other one of these two circuitries. These elements will be discussed in more detail with further figures.

The high voltage summing amplifier (HVSUM), and a power regulator (not shown) that supplies bias voltage to the rotor, operate with voltages higher than the supply voltage of the most of the circuitry. The high voltage may be generated by, for example, a flying capacitor voltage generator. External high voltage supply or even external high voltage amplifiers may be used instead of on-chip voltage generators and amplifiers. High voltage may be for example 10-30 V, while the normal operation voltage may be for example 1.5-5 V. The speed and current requirements for DC bias generation is not high, and it is possible to use purely capacitive voltage generation with or without external capacitors. A switched mode voltage boost generator with at least an external inductor is an option.

In normal operation, the rotor of the resonator (21) of FIG. 2 is biased with a constant rotor bias voltage. The drive electrode of the resonator (21) is connected to a drive voltage (DRV) that includes an AC component and a DC component. Amplitude control of the MEMS resonator (21) of FIG. 2 is done by adjusting DC voltage levels. This is advantageous because it allows constant AC gain and AC properties in the drive loop 22. Constant AC signal and constant AC signal path is beneficial, because the electrical distortion and crosstalk changes are minimized. It also possible to change the feedback polarity, i.e. damp the resonator by changing DC voltage polarity over the drive electrodes. Controlling only the DC component of the drive voltage DRV allows the use of constant rotor bias for detection and drive.

The difference between rotor bias voltage and DC component of drive signal (DRV) from HVSUM amplifier defines a drive bias voltage Vdc over the rotor and stator drive electrodes of the drive capacitor. When the Vdc is considerably larger than zero, a drive voltage AC component Vac from the drive signal DRV produces a large drive force to the rotor. The force to the rotor is proportional to (Vdc+Vac)^2, and the force at $f_0$ is therefore proportional to 2Vdc*Vac. When the DC component of the drive signal DRV and rotor bias voltage are close to each other and the Vdc is therefore near zero, the drive force at $f_0$ frequency decreases close to zero and the drive force at $2f_0$ frequency increases. Negative Vdc turns the sign of the closed drive loop feedback at frequency $f_0$, and the $f_0$ frequency oscillation of the rotor is damped. Normally the Q-value of the rotor is very large and the rotor is not affected measurably at 0 and $2f_0$ frequencies.

In FIG. 2, the detector amplifier is a well-known charge sensitive amplifier (CSA). It provides a precise voltage mode signal from capacitance type sources such as detection capacitances or from piezoelectric transducers. Other types of amplifiers may be used. However, high performance CSA is typically easier to implement than, for example, a transresistance amplifier. A transresistance amplifier is suitable for AC amplification, while it follows well the speed of the movement, but it may be problematic if used with gyroscope because it has high gain in high-frequency region, and it may thus easily wake unwanted modes in a complex gyroscope element. A charge sensitive amplifier (CSA) follows the position of the rotor. As the frequency of the rotor in primary motion is typically essentially constant, CSA is well suitable for gyroscope control due to its integrating nature, reducing susceptibility to high-frequency interference. If voltage difference over a drive detection capacitor (between the rotor electrode and the drive detection electrode of the resonator) is kept constant, the change of capacitance causes change of charge in the capacitor, and the charge sensitive amplifier (CSA) generates a voltage that is in proportion to the charge fed to the charge sensitive amplifier (CSA). Charge sensitive amplifier is typically designed to have very low differential impedance and common-mode input impedance. The drive detection capacitors and charge sensitive amplifier may be differential.

After detector amplifier (CSA) the signal may be filtered and amplified by a high pass filter (HPF). It removes errors caused by DC leak currents and other low frequency noise and errors. The output of the high pass filter (HPF) is the best defined measurement point in the drive loop (22) for rotor movement, also for amplitude measurement. The output of HPF may be used for amplitude detection input of amplitude sampling amplifier (SAMPLING AMP), and for PLL frequency reference, and for closed drive loop input for phase shift device (LPF). Phase shift device (LPF) is preferably a low Q $2^{nd}$ or higher order low pass filter. The phase shift is discussed later in more detail under subtitle "Phase shift in Drive Loop".

A clock signal suitably synchronized with the MEMS resonator (21) is needed for various circuit elements included in or working with the drive circuitry (20), and/or handling signals from the MEMS resonator (21), such as digital signal processing DSP, gyroscope sensing and temperature sensing. In example, the sampling amplifier (SAMPLING AMP) needs a synchronized clock signal for amplitude detection, and detection of the oscillation (not shown) occurs beneficially in synchronization with the oscillation of the MEMS resonator (21) in order to ensure a good quality detection with good signal levels. For such purposes, clock signal needs to be available that is synchronized with the MEMS resonator (21) and the drive loop (22).

For receiving a synchronized reference clock signal from HPF for the PLL, the signal received from HPF output to the clock generation circuitry (23) shall be on sufficient level. The reference clock is produced based on the HPF output by a comparator (COMP1), which will turn the sinusoidal HPF output signal into the reference clock signal that includes a non-sinusoidal signal, in example square wave signal. A band pass filter (BPF) is placed between the drive loop (22) and the comparator (COMP1) to reduce the noise bandwidth of the drive loop (22) signal and to isolate the clock circuitry (23) from the drive loop, thus reducing possible interference caused between the drive loop (22) and the clock circuitry (23). When the MEMS resonator (21) is operational and running in normal operation mode and the drive loop is operational, the output signal from HPF used as synchronized reference clock source for the PLL has sufficient level so that the PLL may be used for generating the needed synchronized clock signals. If the HPF output signal level is too low, the first comparator (COMP1) will not produce a sufficiently steady reference clock signal for the PLL to enable proper locking of the PLL into the wanted frequency. Such situation may occur i.e. during start-up: when the MEMS resonator (21) and the drive loop (22) are not operational in their normal operational mode, the HPF output signal may be too low for generating the required synchronized clock signal with the clock generation circuitry with PLL with sufficient accuracy. When the HPF output signal is not in sufficient level, and PLL cannot reliably provide clock signal synchronized to MEMS resonator, an alternative synchronized clock signal may be provided, created from the output of the low pass filter (LPF). This alternative clock signal is referred as the start-up clock signal (START-UP CLK SIGNALS), and it has inherently correct phase for the sampling amplifier (SAMPLING AMP). During start-up the PLL may re receive an unsynchronized clock (OSC), which would allow the PLL to provide output clock signals with known frequency also during the start-up state. A second comparator (COMP2) may be used to provide the start-up clock signal (START-UP CLK SIGNALS), which may be connected to inputs of circuitry that needs such synchronized clock signal even during the start-up state. A switching arrangement may be provided (not shown) to select between the normal clock signal (CLK SIGNALS) and the start-up clock signal (START-UP CLK SIGNALS) for various elements in or working with the drive circuitry, which have different requirements for the used clock signals. These requirements may change depending on the state the gyroscope device or the drive circuitry is working in. The start-up clock signal, a.k.a. clock shift start-up signal is further discussed in under subtitle "Start-up controller".

Amplitude Control

Amplitude control is advantageously continuous such that when the PLL is able to receive a reference clock signal from HPF, the amplitude control circuitry AGC (24) starts to function to settle the system to a correct operating point. One should notice that the start-up method described in this application may be used also with an amplitude control using other method for controlling the DC bias levels as described here. Also the drive signal may be non-sinusoidal, for example square wave. The phase shift means do not depend on amplitude control implementation.

The amplitude of the resonator is controlled by controlling the DC bias of the drive force generation. For electrostatic excitation and capacitive detection of the resonator rotor, it is advantageous to use accurate constant rotor bias voltage during normal operation after the start-up state and the same constant rotor bias voltage may be easily used for the detection also.

For the purpose of amplitude control it is possible to control either one or both of the DC bias voltages. Controlling the rotor bias voltage during normal operation, however, changes the sensitivity of the drive detection. In case of capacitive detection, the drive detection bias voltage must then be either separated from the rotor drive bias, or the sensitivity change must be taken into account. For example, target amplitude in the amplitude control circuitry (24) after HPF may be adjusted according to a voltage or another parameter that is proportional to the rotor DC bias voltage, or a variable gain in the CSA, or HPF, or between the two blocks. The correction may be made anywhere in the signal path before amplitude measurement or comparison to the target amplitude is done. Effects of the changing DC bias voltages to capacitive detection can be avoided also by using AC-detection, in which a separate AC carrier signal is used for resolving the movement of the rotor.

Figure 3:
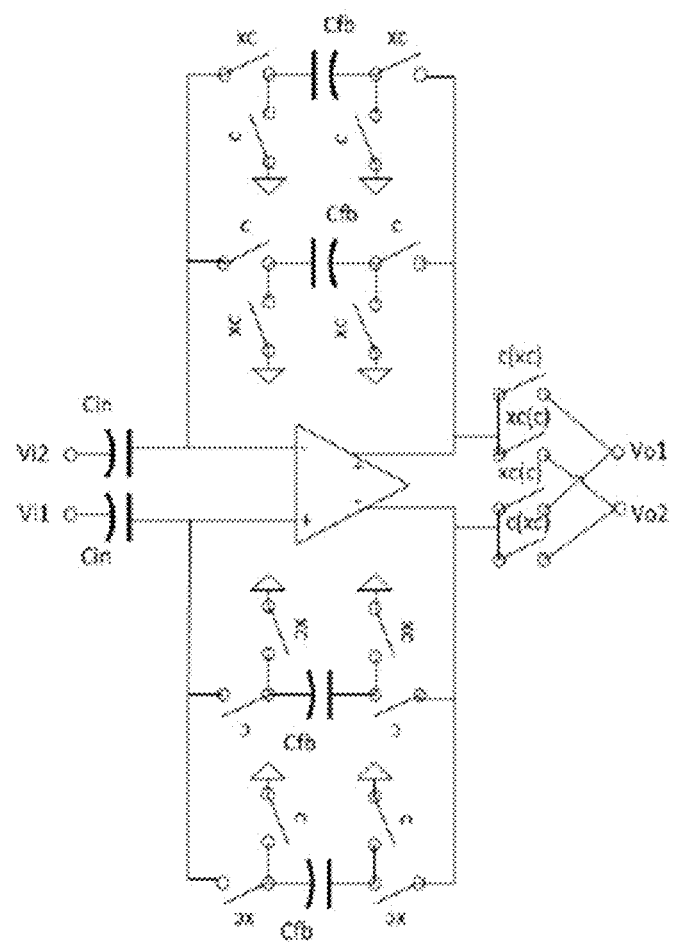
FIG. 3 shows an exemplary sampling amplifier for amplitude control and start-up mode control.

An input signal for amplitude measurement may be taken, as described above, from an output node of the HPF. Offsets or flicker noise should preferably not affect the amplitude information. An efficient method for extracting the amplitude is a switched capacitor (SC) derivator. FIG. 3 shows a SC derivator used as an exemplary sampling amplifier of the amplitude control circuitry (24). The SC derivator is a differential amplifier and inputs two input voltages Vi1, Vi2 to input capacitances Cin. The SC derivator circuit may be clocked at the same frequency as the input signal coming into the sampling amplifier from the HPF, but two amplitude samples may be received per one signal period. This kind of amplitude detection, suitably synchronized with the signal to be detected, may be called as coherent or synchronized amplitude detection. This is accomplished by doubling the feedback switched capacitors Cfb and clocking them in two mutually inverted clock phases C and XC. As the exemplary circuitry is differential, it includes two sets of feedback switched capacitors Cfb, one for both channels (Vi1-Vo1; Vi2-Vo2). With the doubled feedback switched capacitor arrangement, the sampling frequency is doubled, as a sample may be taken in both clock phases. Thus, a sample is received from both input signal phases, so that the peak-to-peak values of the input signal may be sampled. Clock signals C and XC are suitably synchronized with the input signal, which corresponds to the movement of the resonator and the detected signal from the resonator, and have −90 and +90 degrees phase difference with the input signal respectively: When edges of clock signals C and XC occur at peak values of the input signal, the output will produce the peak-to-peak value of the input signal. Offset and flicker noise will be up-converted as the amplifier output is rectified. Offset and flicker noise of the input signal will be removed because of the purely capacitive input impedance. Two samples are thus taken for each input signal cycle, so that each half wave is sampled from peak-to-peak and rectified to output Vo1 and Vo2.

Alternative means to extract the amplitude, possibly more feasible in the digital realization, would be half-wave and full-wave rectifiers, or a traditional multiplier, where the PLL clock would be taken advantage of. However, if used in analog domain, all these methods would require significant filtering to remove the harmonics of the resonance frequency.

The PI-controller of the amplitude control circuitry (24) may sample the sampling amplifier (SAMPLING AMP) output at double rate compared with the resonance frequency $f_0$. The PI-controller may include an integrator and a proportional controller. In FIG. 3, the integrator and proportional controller elements are drawn separately. This may reduce circuit area required by capacitors of the elements. However, a combined PI-controller is feasible as well.

In order to sample a correct amplitude value, the PI-controller sampling phase advantageously ends right before the transition of either c or cx in FIG. 3. The PI-controller compares the sampled input value to a reference and produce respective continuous, zero-order-held, output value. Harmonic content, switching related transients and kT/C-noise can be removed with a low pass filter (not shown) and a CTRL_OUT signal is output. The corner frequency of said low pass filter should not be significantly lower than 10 times the speed of the AGC loop. Proportional and integrator gain can be designed to give desired dynamic properties (speed and damping factor) for the amplitude control. Applicable design details are discussed for example in publication: L. Aaltonen and K. A. I. Halonen: "An analog drive loop for a capacitive MEMS gyroscope." Analog Integrated Circuits and Signal Processing, volume 63, number 3, pages 465-476. © 2009 Springer Science+Business".

The amplitude of the MEMS resonator oscillation is controlled by adjusting the DC bias voltage level provided with the amplitude control circuitry, which is then summed with an AC drive signal provided by the closed drive loop circuitry, so that the two may be fed back by the closed drive loop as a combined feedback signal (DRV) towards the MEMS resonator. The AC drive signal and the DC bias voltage may be summed in a high voltage amplifier, such as the HVSUM.

Start-Up Controller

Start-up circuitry refers herein to a combination of elements that enable quick and reliable start-up and after-shock recovery. Start-up state can be considered as a process with multiple stages, called as start-up stages, which may be commonly referred to as the start-up state, or shortly as start-up. The start-up circuitry is adapted to detect a start-up state. Detecting the start-up state means that it's detected that the MEMS resonator (21) is moving with an amplitude that is less than what has been defined to be the normal operation state, or that the MEMS resonator is not moving at all, and/or not in the MEMS resonator nominal frequency, and that the drive loop (22) does not receive sufficient level input signal from the MEMS resonator (21) to sustain the normal MEMS resonator (21) operation. In response to a detected start-up state, the start-up circuitry is adapted to arrange provision of DC bias voltages to the MEMS resonator in a specific manner. The start-up circuitry (25) may also control generation of different clock signals and provisioning of the generated clock signals depending on the amplitude level of the drive loop (22).

Detection of the start-up state may be implemented in various ways. For example, in the analog drive circuitry of FIG. 2, detection of the start-up state can be realized by sampling the sampling amplifier (SAMPLING AMP) output and comparing this sampled amplitude value to a threshold reference value. If the sampled amplitude value is below the threshold value, the start-up state is detected.

In the first start-up stage, the start-up state is activated by adjusting the at least one DC bias, the drive loop (22) gain is set high as described above. Multiplexing control (MUX CTRL) selects the internal oscillator (OSC) as PLL input signal, and the sampling amplifier (SAMPLING AMPL) and at least the clock reference control (CLK REF CTRL) of the start-up circuitry (25) receive the alternative, synchronized start-up clock signals (START-UP CLK SIGNALS) as clock input. In this mode, the PLL provides a stable clock based on the internal oscillator, but as it's not synchronized with the MEMS resonator (21), the start-up clock signal (START-UP CLK SIGNALS) is used for any circuitries that requires a synchronized clock.

When the sampled amplitude value reaches the given threshold value, the system moves into a second start-up state. Now, the PLL may start using the output signal of the HPF in the drive loop (22) as a synchronized reference clock, and either immediately at the start of the second start-up state, or only after the PLL has been allowed a settling period, the synchronized lock signal provided by the PLL (CLK SIGNALS) may be provided for the elements requiring a synchronized clock. These elements may include, for example, the sampling amplifier (SAMPLING AMP) and the clock reference control (CLOCK REF CTRL). However, the start-up DC bias voltages may still be applied, the drive loop (22) gain may be set to a high value, and due to the high gain in the drive loop signal in the driving loop (22) may be non-sinusoidal. Further, automatic gain control AGC is disabled as in the first start-up state.

Finally, in the third start-up stage, the normal operation state settings are applied and automatic gain control AGC is switched on. Drive loop signal is sinusoidal.

Figure 4:
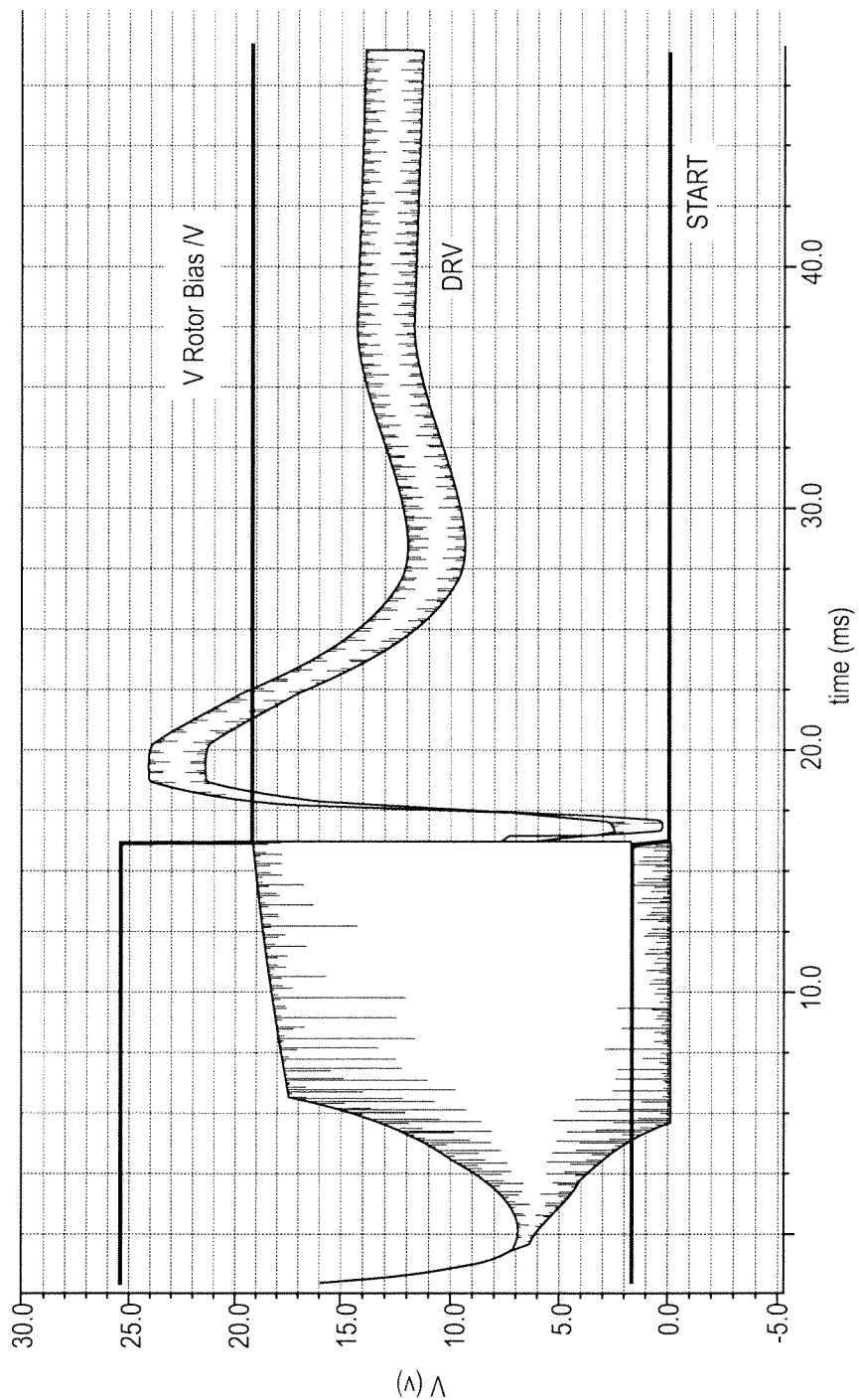
FIG. 4 illustrates a simulation of the system during a start-up state and shortly after the start-up state.

Other detection methods applying two or more threshold values for hysteresis may be applied within the scope. FIG. 4 illustrates a simulation of the system during start-up state and shortly after the start-up state. The START curve corresponds to a start signal that has two values that correspond to detected states of the start-up circuitry, one for the start-up state and one for the normal operation state. The V Rotor Bias curve corresponds to a level of the rotor DC bias voltage. It may be seen that during normal operation, the rotor DC bias voltage has a constant value. For the start-up state, the start-up circuitry may adjust the rotor DC bias voltage to a higher level to increase the drive loop gain and to allow higher DC voltage difference between the drive electrode and the rotor. The DRV curve illustrates the drive voltage that includes the DC and AC components.

It may be seen from the DRV curve that in the beginning, the DC bias voltage component of the drive voltage DC bias is set by the start-up circuitry to about 7 volts. After this, the oscillation amplitude grows nearly exponentially until the amplifiers of the drive loop (22) saturate and cause the drive signal to be almost a square wave. The oscillation amplitude rises until the start-up state ends and the START curve value changes its value. When the start-up state ends, rotor bias voltage is lowered from 25 V to about 19.5V, and the DC bias voltage component of the drive voltage is released from its predetermined start-up value, and the AGC starts to control the amplitude in the normal operating mode.

If the rotor bias is normally higher than the drive signal and detection electrode DC potential, raising the rotor bias value further higher during start-up will raise the gain in the drive loop (~V^2). This reduces the risk of oscillation due to cross talk between the drive and sense signals despite the increased loop gain, and also the drive force is increased when the drive signal is saturated.

According to one embodiment, one of the DC bias voltages may be changed during the circuit power-up after the loop amplifiers are operational. The change in either of the DC bias voltages will generate a small movement to the rotor, pushing it away from its equilibrium position, for starting the mechanical motion of the MEMS resonator, and that will further cause a response in the charge sensitive amplifier (CSA). This will generate an initial impulse to the drive loop (22). This initial response may be rapidly amplified further by the high positive loop gain of the start-up state. The initial impulse may be made fast by controlling the DC bias voltages to predetermined values after the high voltage generator has already raised to voltage enough. If differential drive is used, the drive differential voltage should also be made high before the drive loop (22) is closed. The differential may be made high by, for example, switches in the high voltage amplifier device output, or by switching a predetermined input voltage to the drive amplifier, and then switching the input of the drive amplifier back to closed loop. Also a single ended drive signal can be switched to a voltage level to generate a step function or square wave impulse just before closing the loop by connecting the drive amplifier input and output to normal operation. The drive signal DC level step function may be implemented by drive signal amplifiers also instead or in addition with the impulse generated by change of bias voltage control means. The step function can be fed to near to the output stage of the drive loop. That way only small part of the drive loop needs to have fast setting times from impulse generation to normal closed loop operation. The maximum time for switching the amplifier mode is preferable less than the cycle time of the resonant frequency. Without such initial impulse fed with the change in DC bias voltage, the drive loop (22) would detect only noise induced changes and thus it would start very slowly providing initially only minimal feedback to the MEMS resonator drive voltage (DRV) input. In other words, an initial impulse provided by relative change between the DC bias voltages is used to speed up the start-up of the MEMS resonator and the drive loop.

A steady state is achieved in this example in about 31 ms. The transient visible after the start signal turns to normal state is caused partly by crosstalk from the rotor voltage to drive detection, which tends to cause drive detection amplifier saturation and erroneous amplitude measurement. This over- and undershoot can be further minimized by fine-tuning the end of the start-up state, for example by turning off amplifier increased gain and rotor raised bias voltage at different times before turning on the DC bias P control of the drive voltage DRV, and then finally releasing the I control from reset. Those measures may allow the control to stabilize faster and with less overshoot and/or undershoot in the beginning of the amplitude control after the start-up state is ended.

Timer delays can be used for the sequence the start-up measures during the start-up state. For example, the rotor bias value change and turning off of the high gain operation in the drive loop (22) tend to cause transient interferences to the amplitude measurement. A delay can be used to wait for the transient to end before giving the drive voltage DC bias control to P-control. The I control may be released from reset after a delay of, for example, a few resonance periods when the P control already has made the amplitude and the DC bias close to the steady state, and the I control is not likely to saturate and slow down the settling of the control. This may prevent the I controller from overreacting to transients and the amplitude control may stabilize the drive voltage DC bias and the amplitude of the resonator faster than in FIG. 4 example. Also multiple threshold levels may be arranged into the start-up circuitry for ending or starting different measures. If an accurate clock is needed at any stage during the start-up state, the start-up controller changes the source of the clock signal to internal PLL clock only after the start-up is advanced enough and the PLL is locked.

When there is not yet a proper clock available for a precise start-up control, the clock shift start-up signal generation may be done by using less precise continuous level crossing detection. The clock shift start-up signal is needed when a precise start-up control needs a phase locked clock for accurate measurement and the precise start-up control cannot be used before a proper clock is available from the clock generation circuitry comprising PLL. Also the LPF output may be used as reference for a comparator. Due to the fact the LPF shifts the phase by −90 degrees, a clock generated using LPF output as the reference, can be utilized to sample the amplitude value at HPF output. Thus PLL is not necessarily needed for SC-based initial start-up signal generation. The PLL may also be equipped with a circuitry for recognizing phase locking state and for generation of the clock shift start-up signal. The circuitry for recognizing too low drive loop (22) signal level for creating reference for PLL may initiate change of the used clock signal. In example, a switching arrangement may be provided that connects either the normal clock created with a PLL, or alternatively the clock shift start-up signal, to the clock inputs of the circuitry that requires a phase locked clock, depending on whether the clock created with the PLL is available or not. The clock shift start-up signal has the limitation of not including PLL and therefore the clock frequency of the clock shift start-up signal is limited to at maximum the same as that of the reference signal of the drive loop (22), but on the other hand it is available faster with respect to start-up and therefore may be used during start-up. The clock signal from the clock generation circuitry comprising the PLL is selected, when the signal level from the drive loop is sufficiently high level for creating a stable clock signal within the clock generation circuitry comprising the PLL, and the clock shift start-up signal generated using the output of the low pass filter is selected, when a synchronized clock signal is not available from the clock generation circuitry comprising the PLL. This switching arrangement may be controlled by the start-up controller circuit. The clock shift start-up signal producing circuitry, such as comparator (COMP2), may include part of the clock circuitry (23), but any alternative implementations and/or locations may be chosen for this circuitry within the drive circuitry as understood by a person skilled in the art.

Figure 5:
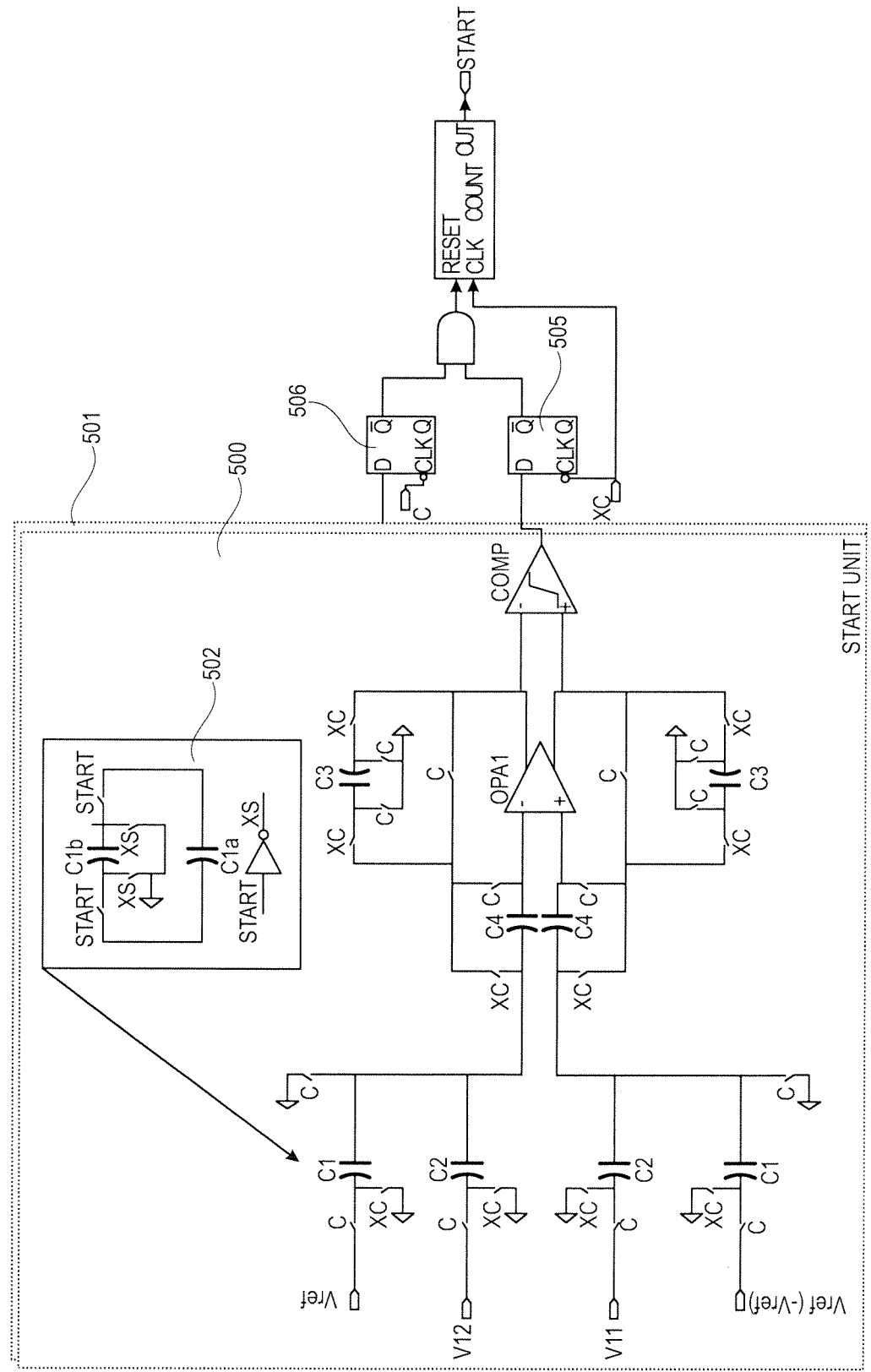
FIG. 5 illustrates an example of a controller circuitry, useable as a start-up mode controller and/or a clock reference controller.

FIG. 5 illustrates an example of a precise controller circuit (START UNIT) useable for example for generation of a start signal of FIG. 4, and for implementing the start-up mode control (START-UP MODE CTRL) element and/or the clock reference control element (CLK REF CTRL) as described in FIG. 2. The controller circuit may be clocked at the same rate ($f_0$) and phase as the PI-controller or at double rate $2*f_0$ compared with the PI-controller in FIG. 3. A comparator (comp) compares combined and amplified charges generated from a reference voltage (2*Vref) and signal (Vi2-Vi1) with respective capacitors (C1, C2), and generates a binary signal out of the preamplified voltage difference between respective input voltage and reference voltage. It should be noted, that although the main figure shows a single capacitor (C1, C2) for each signal chain, and either of both of these may actually represent a controllable capacitor pair such as C1a, C1b as illustrated in the pop-out FIG. 502 representing internal structure of the controllable capacitor (C1). The capacitance of the exemplary controllable capacitor (C1) is adjusted by switches controlled with control signals START and XC, the latter being inverted from the former. In an alternative embodiment, capacitance of the capacitor C1 may be adjustable in any other known manner. The switched capacitor preamplifier including OPA1 amplifies the input signal according to the capacitor ratio (C1/C3) or (C2/C3). The comparator may be followed by a flip-flop gate 505 for sampling the comparator (COMP) output, and/or a counter (COUNT). The sampling may occur twice during each oscillation period, using doubled sampling circuitry, or just once during each oscillation period, i.e. by taking the samples during different polarity periods in consecutive oscillation periods. With one sample per period, doubling of sampling circuitry may be avoided; the sampling frequency will effectively drop to half, but this may not be a critical issue, as the speed of changes is not very fast in the start-up state. However, also the robustness of amplitude detection would suffer from lower sampling frequency, as e.g. leakage current inflicted slewing at the controller circuit START UNIT (500) input could after the sampled amplitude DC value. The clock signals C and XC may include clock signals (CLK SIGNALS) or start-up clock signals (START-UP CLK SIGNALS), or the clock signals C and XC may be derived based on either of these. If the clock frequency for C and XC is $2*f_0$, a single controller circuit START UNIT (500) is needed. However, if the clock frequency received at C and XC is $f_0$ (equal to the resonance frequency), two controller circuits START UNIT (500) are needed. This is described with the second, grey dotted line presenting the second controller circuit (501), and a second flip-flop gate (506) serving as sampling element of the second controller circuit (501), also marked with grey color to highlight the optionality. The two controller circuits (500, 501) may be similar to each other, except that the clock signals C and XC are inverted between the two units. In case two START UNITs (500, 501) are needed, they may share a common counter (COUNT).

Comparator output may be sampled at the end of preamplifier change transfer phase in the controller circuit (500) marked as XC-phase to prevent switching transients from affecting the output. Precise hysteresis for the start-up may be created using at least one start signal-controllable reference capacitor C1 in FIG. 5. Optionally the signal capacitors could be made tunable. With these setups, the start signal can be deactivated (the start-up state ended), for example, when the input signal (Vi2-Vi1) corresponds to a specific target amplitude in the amplitude control circuitry, while reactivation would require the input signal to descent to a lower value e.g. to 80% of the target amplitude. Without a proper clock signal from the internal PLL, the start-up controller circuitry doesn't turn the start signal off too early, because an incorrect clock signal would cause the amplitude sampling to give too small results. The controller circuitry of FIG. 5 doesn't therefore need any detection of proper clock signal, as long as the PLL is locked before the upper threshold should be triggered and the start signal turned off.

When the controller circuit works with a clock having a frequency $2*f_0$, i.e. double the frequency of the MEMS resonator (21), it takes two samples during each fundamental period of the MEMS resonator oscillation. Both measured samples taken during a fundamental period of the MEMS resonator frequency need after rectification (shown in FIG. 3 circuit output) to be greater than or equal to a set reference level before the start-up state may be disabled or before the reference signal multiplexer (sell in FIG. 2) may select the synchronized reference signal coming from the drive loop (22) for the clock circuit with PLL. A counter (COUNT) acting as digital delay element may be placed after the flip-flop gate (505) to prevent single comparator pulses from activating the start-up state. The counter (COUNT) placed after the flip-flop gate (505) may count samples only when start-up state is being activated, or when oscillator signal is being activated to be used as reference to the PLL. Use of the counter (COUNT) enables avoiding use of the clock signal (CLK SIGNALS) when it is not stable, i.e. when PLL is not settled during start-up or during change of operation mode, or due to any occasional disturbances. Counter (COUNT) changes its output stage immediately when both samples taken during a single fundamental period are detected to exceed the preset reference level. The controller circuit (500, 501) amplifies the signal in the switched capacitor preamplifier including OPA1 and also ensures that any offset voltage is removed from the signal. This is accomplished with the CDS capacitors C4 and respective switches.

Ending the start-up state close to the target amplitude allows a high speed (high force) drive to be used as long as optimally possible, while a low force nominal drive AC is employed only minimally for final mechanical amplitude adjustments. The amount of hysteresis can be controlled by the ratio between reference capacitors C1 and C2.

If the rotor DC bias voltage is made higher during start-up, the overall closed loop gain of the drive loop is higher during start-up because of the increased detection and drive sensitivity, and the amplitude measurement from the output of the HPF is also amplified. This can be compensated by lowering the gain before amplitude measurement is done, for example in CSA, or in the HPF. Also the sampling amplifier (SAMPLING AMP) gain can be lowered or damped to compensate for only the amplitude measurement. If the effect of the rotor bias increase is compensated before amplitude measurement within the drive loop, the overall gain in the closed drive loop is constant. Compensating only the amplitude measurement sampled from the closed loop, would make the drive loop overall gain and drive signal amplitude rotor DC bias voltage dependent. This would result larger signal levels in the drive loop signal path and that may limit the maximum dynamic range available for steady-state amplitude measurement and control, because the amplifiers before the amplitude sampling and gain compensation may saturate. This may force to limit the gain of the amplifiers before the amplitude sampling point, or limit the maximum rotor bias voltage low enough for correct target amplitude detection also with the maximum rotor bias.

The hysteresis limits of start-up controller may also take in account the raised detection gain during start-up only. If the high rotor bias voltage and therefore higher than normal detection sensitivity is used only during start-up, the higher gain amplitude measurement may also be used only for the start-up control when deciding the stop of the start-up state. The threshold for ending the start-up may be raised according to the amplified amplitude measurement. The threshold of the start-up controller can be altered by changing the capacitance ratios only, and the reference voltage may be constant. When the start is ended, the higher threshold will be far away from normal amplitude measurement with normal detection sensitivity. The lower threshold should be lower than the amplitude measurement corresponding to the measurement just after the rotor bias is lowered to normal. For example, if the normal state amplitude target value is 1.0 V, and high rotor bias amplifies the measurement by 50%, the stop threshold may be about 1.5V. When the rotor bias is lowered to normal, the amplitude measurement will be near 1 V, and the lower threshold should be less than 1V, say 0.8 V or 0.9 V in order to prevent unnecessary restart. The higher threshold may still be 1.5 volts, because it is not activated unless there is a restart, and the start signal and high rotor bias voltage is turned on again.

Unnecessary restart can be prevented also by counter (COUNT) delay that forces the start-up circuitry to wait some time before the start signal is allowed to restart the drive loop again. The fact is however, that when the digital delay is present also during power-up, the start-up logic must receive at least some random clock to activate the start-up state, or alternatively the logic must be reset to the start-up state. Adding a delay (COUNT) in the start-up circuitry will block also a single start-up control pulse from causing restart. The measurement result of start-up control may still be used to signal that the resonator is not yet in normal oscillation.

Also amplifier gains and/or the amplifier bias currents and/or high-pass corner frequencies may be increased during the start-up state. If the gain is increased during start-up in an amplifier after the LPF output point in FIG. 2, there is no significant effect to the amplitude measurement sensitivity from the output of the LPF. The raised gain will increase the amplitude of the drive AC voltage. Increased amplifier bias currents improve possible phase errors in high gain operations, and higher corner frequencies allow faster DC operation point setting of the amplifiers in the drive loop. Also the corner frequencies of the HPF and CSA may be raised during the start-up in order to speed up the setting of the DC voltage levels and amplifier operation points through the drive loop. This would allow also faster setting to normal or start-up state operation, in case the CSA and/or HPF would saturate during power-up or rotor bias shift. For this reason the HPF and/or CSA corner frequency may be kept high also for a while after start-up as the rotor bias voltage is changed.

In the beginning of the start-up, the start-up circuitry may also start different start-up measures sequentially at different times.

As an example of this different timing of start-up measures, the start-up state may be considered as a three stage process from initiation towards normal operation state. In the first start-up stage, the start-up is initiated by adjusting the at least one DC bias, and setting the drive loop (22) gain high as described above. Multiplexing control (MUX CTRL) selects the internal oscillator (OSC) as PLL input signal, and the sampling amplifier (SAMPLING AMPL) and at least the clock reference control (CLK REF CTRL) of the start-up circuitry (25) receive the alternative, synchronized start-up clock signals (START-UP CLK SIGNALS) as clock input. In this mode, the PLL may provide a stable clock based on the internal oscillator (OSC), but as it's not synchronized with the MEMS resonator (21), the start-up clock signal (START-UP CLK SIGNALS) is used for any circuitries that require a synchronized clock.

When the sampled amplitude value reaches the given threshold value, the system moves into a second start-up stage. During this stage, the PLL may start using the output signal of the HPF in the drive loop (22) as a synchronized reference clock, and either immediately at the start of the second start-up stage, or only after the PLL has been allowed a settling period, the synchronized lock signal provided by the PLL (CLK SIGNALS) may be provided for the elements requiring a synchronized clock. These elements may comprise i.e. the sampling amplifier (SAMPLING AMP) and the clock reference control (CLOCK REF CTRL). However, the start-up DC bias voltages may still be applied, the drive loop (22) gain may be set to a high value, and due to the high gain in the drive loop signal in the driving loop (22) may be non-sinusoidal. Further, automatic gain control AGC is disabled as in the first start-up stage. The selection between used clock signals is controlled by the start-up circuitry START CTRL (25), comprising start-up mode control (START-UP MODE CTRL) and clock reference control (CLK REF CTRL).

In the third start-up stage, the normal operation state settings are applied and automatic gain control AGC is switched on. Drive loop signal is sinusoidal and approaches normal operation.

Phase Shift in Drive Loop

A drive loop, which detects the position information of a resonator as electronic signal and feeds the amplified signal back to the resonator, needs to phase shift the signal in order to provide a positive feedback and make the loop oscillate at resonant frequency.

It is also preferable to minimize parasitic gain that may even excite unwanted oscillations or may cause amplification of unwanted noise or crosstalk. A capacitively detected and driven MEMS-resonator requires high gain from the drive loop amplifiers at least during the start-up. A robust and still simple phase shift means in the drive loop for a MEMS resonator is needed.

When capacitive information from the resonator is detected using a conventional charge sensitive amplifier CSA in FIG. 2, the voltage mode signal at the amplifier output is at the same phase as the element position. Compared with the drive detection amplifier CSA output, the excitation signal must be 90 degrees phase shifted in order to realize an oscillator that oscillates at the resonance frequency. CSA is typically preferred over transresistance amplifier TRA (R dominates over C) because on-chip capacitance is typically much more stable than an on-chip resistor. Transresistance amplifier provides output voltage that is nearly relative to speed of the resonator, and the phase is about 90 phase shifted compared to charge sensitive amplifier.

Prior art solutions for attaining the phase shift typically use at least an integrator or a differentiator (derivator) circuit in analog or digital domain. Both of these phase shifting methods actually require additional filtering. Offset in the case of integrator and high-frequency gain in the case of differentiator force to realize the phase shifting element as a low-pass (or in-fact band-pass) and high-pass filter, respectively. Parasitic gain can excite unwanted oscillations due to cross-coupling or due to parasitic resonance modes of the element and low frequency time-constants take considerable circuit area. PLL can provide a robust alternative to other phase shift implementations, but it requires moderately complex start-up procedure and heavy harmonic drive power or complex filtering.

In an embodiment, a phase shifting element may be based on second order (or higher, in example a fourth order) continuous-time low-pass filter architecture. This allows good tolerance to production parameters and reliable and stable start-up and operation of the oscillation. The general transfer function of a second order low pass filter is of the form $$H(s)=1/(s^2/\omega_0^2+s/Q\omega_0+1),$$

where $\omega_0=2\pi f_0$ is the natural frequency and $Q=1/(2\xi)$ the quality factor of the filter. When Q is set to be low, e.g. unity and $\omega_0$ to match the resonance frequency of the gyroscope, i.e. the resonance frequency of the MEMS resonator, the filter creates the necessary 90 degree phase shift at $\omega_0$, at frequency equal to the mechanical frequency of the MEMS resonator. When a low pass filter is used for phase shifting, the phase shift will be negative, i.e. −90 degrees. The out-of-band gain, in this case referring to the low-frequency gain, is higher by only $1/Q$.

Figure 6:
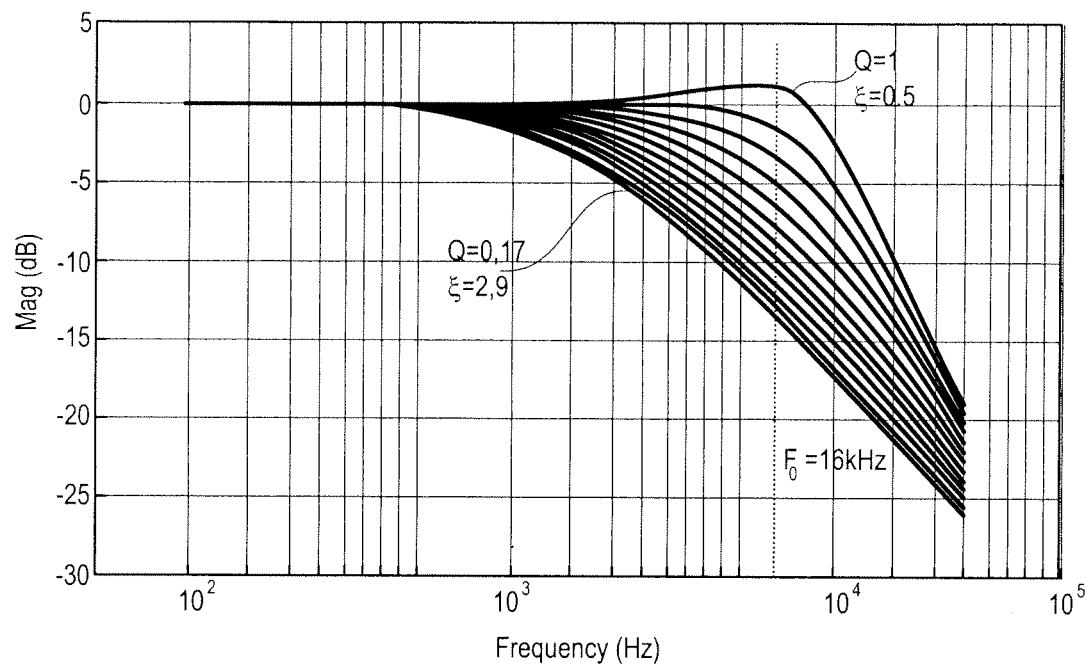
FIG. 6 illustrates example filter gain transfer functions for different damping and Q factors.

FIG. 6 illustrates example filter gain transfer functions for different damping and Q factors. The $f_0$ is 16 kHz for all curves, and the damping factor is 0.5 and Q=1 in the highest curve. It may be seen that high frequency gain is attenuated with the characteristics provided by the second order filter. In view of these facts, high-Q would be beneficial but would require very precisely matching LPF $\omega_0$ and resonator $\omega_0$.

Figure 7:
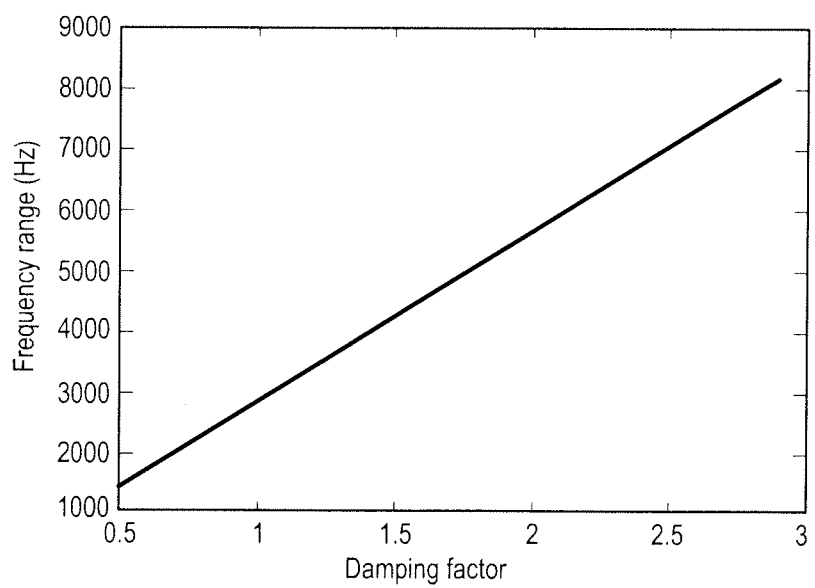
FIG. 7 illustrates a tolerated resonance frequency range with maximum error of 5 degrees as a function of damping factor ($\xi$)

At low Q values the LPF, however, tolerates higher mismatch between the resonance frequencies of the element and the LPF corner frequency. For example, if the phase error of the drive or excitation signal is specified to be 5°, a frequency mismatch is plotted as a function of damping factor in FIG. 7. Clearly the greater the damping, the smaller the Q, and the higher the tolerated frequency mismatch. Optimal (minimum) damping factor may thus be found by searching through the worst case combination of environmental and partly process variations across which the system is required to function. Robust Q can be, for example, 0.5 that tolerates +−9% frequency mismatch at 5° maximum error.

The analog realization of an on-chip LPF is likely to experience a high process related variation of corner frequency. In an embodiment, this can be calibrated by designing an oscillator e.g. an astable multivibrator, whose frequency is dependent solely on RC-matrix build from similar components as the ones used in the LPF.

Figure 8:
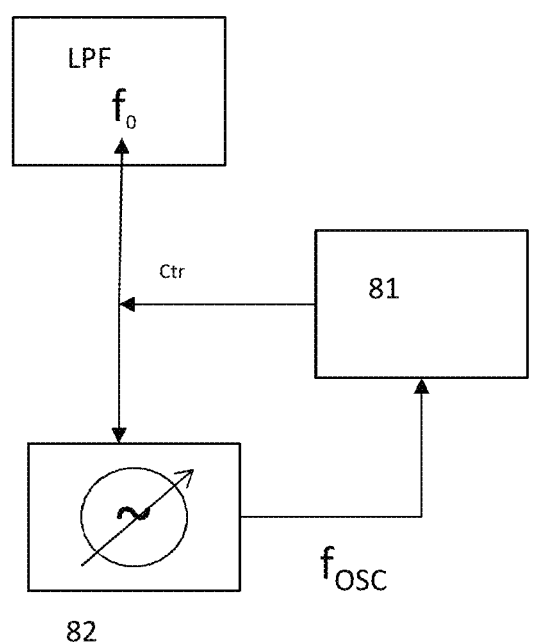
FIG. 8 illustrates a schematic of an exemplary circuitry for tuning the corner frequency of a low-pass filter.

FIG. 8 illustrates a schematic of an exemplary circuitry for tuning the corner frequency of LPF. Low pass filter LPF and oscillator 82 may be made with matching controllable circuit elements, like resistors, transistors or capacitors in such way that they have a matching component parameter to frequency dependency between the low pass filter and the oscillator. When the low pass filter LPF and the oscillator 82 are in the same integrated circuit chip, then they have been made with the same process to the same substrate, and therefore there are no process related differences between the corresponding matching components of the two devices.

The oscillator 82 frequency is measured by a tuning circuit 81, and the tuning circuit 81 tunes the oscillator 82 frequency $f_{osc}$ to the target value by adjusting a control signal Ctr. The control signal is, for example, a voltage signal, or a digital word for controlling a capacitor bank or resistor bank.

Figure 9:
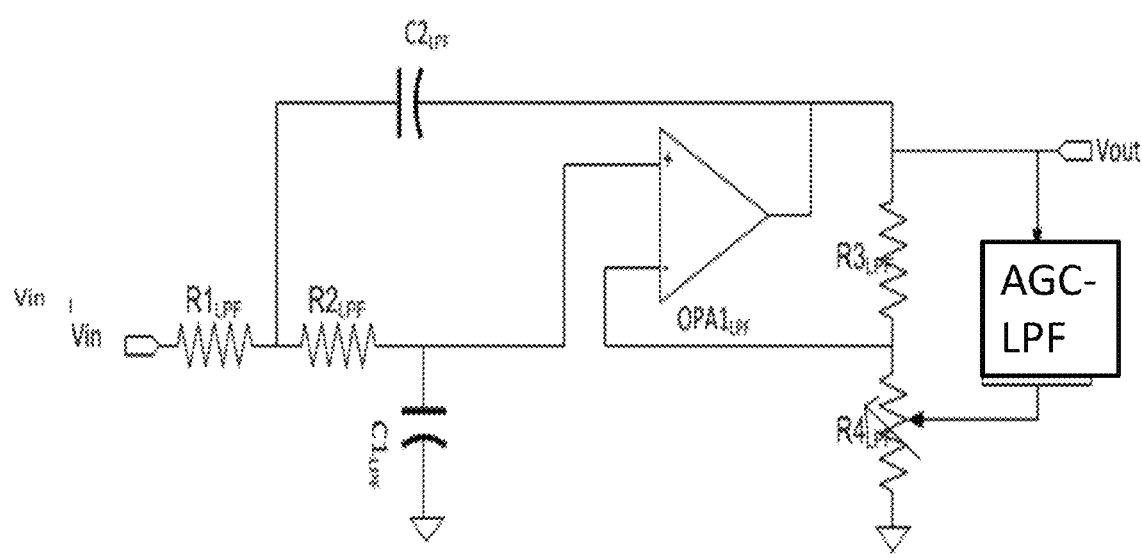
FIG. 9 illustrates a Sallen-Key topology low pass filter with gain control for enabling its use as an oscillator.

One embodiment of the tunable oscillator means is to use the low pass filter itself as part of an oscillator. This can be done by using, for example, a Sallen-Key topology second order low pass filter as depicted in FIG. 9. The gain control AGC-LPF is added to the basic filter design. Gain control can increase the gain to a level where the circuit starts to oscillate at the natural frequency of the low pass filter. The gain control then limits the oscillation amplitude to the linear operation level and keeps the oscillation sinusoidal. The input voltage Vin of the circuit should be connected to analog ground or to a constant low-impedance source. After the frequency is adjusted, the same tuning values are used to operate the circuit as low pass filter. The gain control AGCLPF is turned off, and the Resistor $R4_{LPF}$ may be replaced by an open circuit, and small or zero valued $R3_{LPF}$ works as feedback resistor. With these settings the gain of the amplifier is unity. The resistor values R3LPF and R4LPF may be used to control or alter the gain of the amplifier and consequent Q-value of the low pass filter.

Using the same circuit as a low pass filter and as an oscillator may be used to feed the oscillator signal to the resonator as drive signal. This may excite the resonator when the oscillator frequency is same as the MEMS resonator resonant frequency. If the detected signal is looped back to the input of the oscillator, it would likely make the tuning difficult, as the MEMS-resonator and the oscillator may interfere each other, and coupled oscillation may complicate tuning of the oscillator to the desired frequency, if tuning rather effects on beat and/or amplitude of the system than output frequency of the LPF. The oscillator may, however, be used also to resolve the natural frequency of the MEMS resonator by finding the frequency that generates the amplitude maximum in the MEMS-resonator. This can be done by connecting the LPF input to the analog ground (or other DC value), and opening driven loop signal path before the input of the LPF. This would allow the PLL of the drive loop circuitry to lock at the oscillator frequency point which matches the resonance frequency and creates sufficient mechanical motion. As the PLL may be functional also the drive loop amplitude control may be operational, and the matching oscillator and MEMS resonance frequency point may be resolved by measuring the gain controller output. This embodiment allows measuring the MEMS oscillator frequency, and tuning the LPF corner frequency at the same time. However, it is likely that frequency sweep time becomes slow, as the high Q-valued MEMS must be capable of responding to each LPF oscillation frequency point. Suitable amount of coupling from MEMS detection to LPF input may be used to tune coupled oscillation of the LPF and MEMS resonator to a resonance maximum. In that case the LPF oscillator resonance frequency is measured indirectly using the MEMS-resonator frequency as tuning reference and finding the amplitude response maximum of the MEMS resonator. Also this case each LPF tuning value measurement needs to wait the MEMS resonator response.

Another embodiment uses a separate oscillator for resolving the tuning parameters of the low pass filter. In practice the design of the tuning circuitry with separate low pass filter and oscillator is typically done by designing first the LPF, and preferably selecting LPF component values so that resistors and capacitors have either identical values in both devices or the component values may be implemented as fixed ratios so that only identical components in parallel or in series need to be tuned. For example there may be two capacitors with the same component values, or two tunable capacitors with integer ratios allowing the use of tunable value unit components. For example capacitor ratio 2C:3C can be built from 5 pieces of 1C valued unit capacitors that are tuned with same parameters. Also the other non-adjustable component values may be made out of unit values or only one component value may be used. For example, all resistors may have same value R, or may be built from one value components in parallel or series.

Then the oscillator may be designed using same unit component values as in the LPF, either as a single unit component or as many same value components in parallel or series. The target frequency of the oscillator may be defined after that by calculation or simulation. The target frequency will then have a fixed ratio to corner frequency of the LPF. The actual frequency depends on the selected type of the oscillator.

The applicable oscillator types include at least an astable multivibrator, a Wien bridge oscillator, a twin-T oscillator, and a RC-phase shift oscillator. Different oscillator designs may produce different output frequencies with same RC-values. Still, both the low pass filter and all above named oscillator types have a RC-value to frequency dependency F=k/(RC), where k is a constant that can be calculated or simulated for each oscillator design.

Oscillator frequency may be measured by a digital counter, and the target frequency for the oscillator is therefore easy to set as needed. The oscillator tuning parameters may be resolved without need for external input signal to the low pass filter. The tuning may be made only once during the initial calibration of the device, and the control of calibration may be external. For example the external computer may read the frequency measurement and control the tuning parameters through a data bus in the circuitry, and finally the tuning parameters may be written into a nonvolatile memory of the circuitry.

By tuning the frequency of the oscillator to be correct i.e. to a target frequency with matching RC-component values for the target LPF corner frequency, the found tuning values can be imported to the LPF using the same or a corresponding matched control signal Ctr for adjusting the low pass filter also. Thus, no external signal source is needed for measuring the frequency response of the LPF, while matching between LPF and oscillator will take care of correct LPF corner frequency. This calibration strategy makes it easy to calibrate the phase shift device with simple on-chip device. Instead of RC matrixes, also corresponding switched capacitor matrixes can be used in the oscillator and in the filter.

The frequency of the oscillator may be selected from a number of alternative frequencies. For example two parallel capacitors may be tuned with same values as one similar capacitor working in double frequency, or the frequency may be doubled by using two parallel resistors. This may be advantageous for saving space for oscillator, or oscillator frequency may be selected to a frequency that is not likely to cause interferences. Higher frequency may be used for faster frequency counting. Lower frequency may be beneficial for accuracy or for saving supply power.

The tunable or non-tunable or both components may be scaled for changing oscillator frequency. Scaled component values are usually made by combining many identical unit components, for example, if relative capacitance values 3C and 3.3 C are needed, they are made by 10 and 11 pieces of 0.3 C identical units. Use of unit size and same shape components eliminates relative variation because of different circumference length compared to area. Because the capacitor or resistor circumference properties have often large process related variations, the oscillator and the low pass filter should have tuning components built from identical blocks, but the number of blocks may be different. If the low pass filter needs two or more different value components that should be tuned it is also possible to tune the components separately with two oscillators or with one oscillator by tuning the oscillator to two different frequencies and copying corresponding tuning values to the low pass filter. That case the above mentioned 3.0C and 3.3C capacitances can be made out of, for example, 2.7C single non-tunable capacitors and two 0.1 to 0.5C adjustable range tuning capacitors in parallel. Then two capacitor tuning parameters can be resolved in turns by a single oscillator.

The tuning circuit 81 may store the tuning values for future use. The values may be stored to an internal or external memory. If the values are stored in a nonvolatile memory, they may be used in future, and there may be no need to tune the device again after initial tuning. The tuning may also be made for multiple temperatures, and the corresponding tuning values may be saved to a temperature compensation table. The tuning values may be used for interpolation of tuning according to temperature or as initial values only. The tuning may be made only once, after each start-up, or on demand, as there is no need for continuous tuning. The tuning circuit 81 may even be at least partly external, or the measured tuning values may be stored by external programming device for example during factory tests of the device. A MEMS gyroscope primary resonator may be calibrated in the factory, and the tuning is part of the calibration. The tuning parameters may be stored in programmable memory with other calibration parameters. The programmable memory may be one time writeable permanent memory, and the calibration is made only once in device lifetime.

Tunable elements in the low pass filter and in the oscillator may, for example, include a bank of capacitors in parallel. Typical set is binary series with switchable capacitance values directly controllable by a digital word. The values of switchable capacitances may be 1C, 2C, 4C, 8C etc. The bank may be parallel with a larger capacitor to be tuned. For example above 4 bit controlled bank gives 16 tuning steps of 1C, and if it is in parallel with 92C capacitor, the combined capacitor is about 100C+−7% tunable range with 1% steps.

For resistors, the parallel connected values may be 1R, R/2, R/4, R/8 etc. Then the digital control word effects directly to component 1/R value (conductance) as tuning parameter.

Often several same size capacitors or resistors are used instead of different value single components as explained above. However, there is no need to know the tuning component value, but only the parameters to repeat the same adjustment in two devices. Therefore it is possible to use nearly arbitrary sizes components in the bank as long as in combination there are no gaps in the available combined component values of tunable components. The oscillator and the LPF must have identical tunable components, but the banks of switchable component may include different size components, and they do not need to be binary coded. In order to avoid gaps in the values of parallel connected values, some redundancy may be added to the bank. For example power-of-two binary series may be added some intermediate values or some added small value components that can be used to cover possibly missing tuning values. For example between the binary values 4, 2, 1 can be added extra values like 6 and 3. They can be used to cover any gap of missing output values up to nine missing output values. The gap with missing output values is usually caused by the most significant control value being too large. Redundancy can be added also by using coarse tuning bank and fine tuning bank so that the fine tuning bank has a tuning range that is larger than the possible missing range of the coarse tuning bank.

Initial calibration for LPF may be done by taking advantage of matching between the frequency reference and the LPF. From the drive loop perspective there is no need for precise initial calibration as more precise final calibration can be done after the MEMS oscillator is running. Thus the final calibration can be done by calibrating the phase shift when signal traverses the LPF. For initial calibration it is sufficient to know that first same type of devices are used both for the LPF and the oscillator, and second the frequency ratio between LPF and oscillator is known, preferably constant. For more precise initial calibration, matching components, resistors and capacitors, may be used for in the LPF and the oscillator, using the generally known layout techniques of ASIC design.

In order to reduce calibration time, a very predicable behavior is relevant. This allows output results to be predicted by calculation, without need for testing each separate calibration setting. Hence, whether binary controlled matrix or other type calibration sets for component value is used, is of little importance from calibration point of view as long as the calibration control is predictable.

Also a tunable single component may be used. A capacitance diode, ferroelectric varactor or a controllable resistor, like MOSFET transistor in linear mode are examples of tunable elements that may be used.

The adjustable parameter span must cover at least the process related component value tolerances in absolute values, and also the tolerance in the resonance frequency of the resonator. Also the temperature compensation may be needed.

According to an embodiment the adjustable frequency band may cover larger frequency band than needed for compensating the tolerances of one resonator and drive loop circuit product pair. If the frequency range is made large enough, several different frequency resonator models may be used with one type of drive loop circuit. Because the tuning circuit needs frequency reference that can be used for resolving the resonator frequency $f_0$, the tuning parameters may be measured in the first start-up, and written to calibration memory. These tuning parameters may be used later as initial values for the tuning circuit 81. This embodiment allows configuration of one drive loop circuit for several different frequency resonators. The configuration may be made in the initial factory test after the resonator and drive loop circuit are installed together to a system or as a module.

The use of the low pass filter according to the embodiments above allows a more robust start-up. The resonator is much less likely to start in a secondary resonant mode, even when an impulse with a large secondary resonant frequency component is fed to the resonator in the beginning of the start-up. The robust operation is accomplished by the characteristics provided by the LPF including first, the phase shift that turns to 180° sufficiently above natural frequency and prevents energy transmission to parasitic resonance modes, second, increasing attenuation above natural frequency, and third, low DC gain compared with gain at the operating frequency.

It is apparent to a person skilled in the art that as technology advances, the basic idea of the invention can be implemented in various ways. The invention and its embodiments are therefore not restricted to the above examples, but they may vary within the scope of the claims.

The invention claimed is:

1. A drive circuit for a MEMS resonator, said drive circuit comprising;
   a drive loop circuit configured to detect and amplify a signal;
   a phase shifting circuit configured to phase shift the detected and amplified signal; and
   a feedback circuit configured to feed the detected, amplified and phase shifted signal as a feedback signal back to the MEMS resonator,
   wherein the phase shifting circuit is a low pass filter of at least $2^{nd}$ order having a continuous time low pass filter architecture, and
   wherein a 90 degree phase shift target frequency of the low pass filter is equal to the mechanical resonance frequency of the MEMS resonator.

2. The drive circuit according to claim 1, wherein
   a target nominal frequency of the low pass filter is equal to a mechanical resonance frequency of the MEMS resonator.

3. The drive circuit according to claim 1, wherein a corner frequency of the low pass filter is configured to be tuned by a tuning circuit comprising an oscillator disposed on a same integrated circuit as the low pass filter; and
   the tuning circuit is configured to tune the oscillator to a defined frequency by adjusting tuning parameters of the oscillator; and
   wherein the tuning parameters of the oscillator are configured to resolve tuning parameters of the low pass filter.

4. The drive circuit according to claim 3, wherein the low pass filter is configured to operate as the oscillator for resolving the tuning parameters.

5. The drive circuit according to claim 4, wherein the low pass filter operating as the oscillator is configured to excite the MEMS resonator for measurement of a resonance frequency of the MEMS resonator.

6. The drive circuit according to claim 3, wherein the oscillator is separate from the low pass filter, and an oscillator frequency is tuned by tuning RC-oscillator resistance or capacitance values within the oscillator, and tuned resistance or tuned capacitance values corresponding to defined tuned frequency of the oscillator define resistance or capacitance values of the low pass filter to tune a low pass filter corner frequency.

7. The drive circuit according to claim 6, wherein for low pass filter corner frequency $f_0$, an oscillator target frequency corresponding to tuning parameters is scaled compared to $f_0$ by a ratio defined by selection of component values or RC-circuits and circuit topologies of the low pass filter and the oscillator.

8. The drive circuit according to claim 3, wherein the oscillator and the low pass filter comprise a switched capacitor tuning circuit, and capacitance values or a clock signal of the tuning circuit or configured to be tuning parameters.

9. The drive circuit according to claim 3, wherein for low pass filter corner frequency $f_0$, the oscillator frequency is selected to be $n*f_0$, when n is a constant or defined value, and corresponding clock frequency or capacitance values of the low pass filter are scaled correspondingly.

10. The drive circuit according to claim 3, wherein the tuning circuit comprises a bank of parallel connected components and a switching circuit.

11. The drive circuit according to claim 3, wherein a reference clock frequency for measuring the oscillator frequency is derived from a frequency of a drive loop driven resonator.

12. The drive circuit according to claim 1, wherein an oscillation amplitude of the MEMS resonator is controlled by adjusting a DC bias voltage level summed with an AC drive signal provided by a closed drive loop circuit, wherein a DC bias voltage is provided by an amplitude control element.

13. The drive circuit according to claim 1, wherein a clock signal for detecting an amplitude of the detected and amplified signal is created in one of:
   a clock generation circuit comprising a PLL, when a signal level from the drive loop circuit is sufficiently high level for creating a stable clock signal within a clock circuit comprising the PLL, and
   a clock shift start-up signal generated using an output of the low pass filter, when a clock signal is not available from the clock circuit comprising the PLL.

14. The drive circuit according to claim 1, further comprising a switched capacitor derivator circuit configured to provide rectified output samples of an input signal in both clock phases, the switched capacitor derivator circuit comprising at least one set of feedback switched capacitors with zeroing switches, the switched capacitor derivator circuit being configured to receive a clock signal having a same frequency as a switched capacitor derivator circuit input signal received from a drive loop, and the zeroing switches of the at least one set of feedback switched capacitors being configured to be operated by two mutually inverted clock phases.

15. A MEMS oscillator, comprising the drive circuit according to claim 1.

16. A MEMS gyroscope, comprising the drive circuit according to claim 1.

17. A method for driving a MEMS resonator, the method comprising:
   detecting and amplifying a signal of the MEMS resonator;
   phase shifting the detected and amplified signal; and
   feeding the detected, amplified and phase shifted signal as a feedback signal back to the MEMS resonator,
   wherein the phase shifting the detected and amplified signal is effected with a low pass filter of at least $2^{nd}$ order having a continuous time low pass filter architecture, and
   wherein a 90 degree phase shift frequency of the low pass filter is set equal to the mechanical resonance frequency of the MEMS resonator.

18. The method for driving a MEMS resonator according to claim 17, wherein
   a nominal frequency of the low pass filter is set equal to a mechanical resonance frequency of the MEMS resonator.

19. The drive circuit according to claim 14, wherein the at least one set of feedback switched capacitors comprises two feedback switched capacitors.

* * * * *